US008941442B2

(12) United States Patent
Youngner et al.

(10) Patent No.: US 8,941,442 B2
(45) Date of Patent: Jan. 27, 2015

(54) FABRICATION TECHNIQUES TO ENHANCE PRESSURE UNIFORMITY IN ANODICALLY BONDED VAPOR CELLS

(71) Applicant: Honeywell International Inc., Morristown, NJ (US)

(72) Inventors: Daniel W. Youngner, Maple Grove, MN (US); Jeff A. Ridley, Shorewood, MN (US); Son T. Lu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 311 days.

(21) Appl. No.: 13/662,850

(22) Filed: Oct. 29, 2012

(65) Prior Publication Data

US 2013/0052405 A1 Feb. 28, 2013

Related U.S. Application Data

(63) Continuation-in-part of application No. 12/879,394, filed on Sep. 10, 2010, now Pat. No. 8,299,860.

(60) Provisional application No. 61/301,497, filed on Feb. 4, 2010.

(51) Int. Cl.
*H01L 21/31* (2006.01)
*H01S 1/06* (2006.01)
*G04F 5/14* (2006.01)

(52) U.S. Cl.
CPC .......... *G04F 5/14* (2013.01)
USPC .......... 331/94.1; 438/455; 438/456

(58) Field of Classification Search
USPC .......... 331/94.1; 428/116; 438/116, 118, 119, 438/455, 456; 372/55, 56
See application file for complete search history.

(56) References Cited

U.S. PATENT DOCUMENTS 6,570,459 B1 5/2003 Nathanson et al.
7,292,111 B2 11/2007 Abbink et al.

(Continued)

FOREIGN PATENT DOCUMENTS

EP 1591846 11/2005
EP 2136272 12/2009

OTHER PUBLICATIONS

Japanese Patent Office, “Notice of Allowance from JP Application No. 2010-252833 mailed Aug. 27, 2014”, from Foreign Counterpart of U.S. Appl. No. 12/879,394, Aug. 27, 2014, pp. 1-4, Published in: JP.

(Continued)

*Primary Examiner* — Joseph Chang
*Assistant Examiner* — Jeffrey Shin
(74) *Attorney, Agent, or Firm* — Fogg & Powers LLC

(57) ABSTRACT

A method of fabricating one or more vapor cells comprises forming one or more vapor cell dies in a first wafer having a first diameter, and anodically bonding a second wafer to a first side of the first wafer over the vapor cell dies, the second wafer having a second diameter. A third wafer is positioned over the vapor cell dies on a second side of the first wafer opposite from the second wafer, with the third wafer having a third diameter. A sacrificial wafer is placed over the third wafer, with the sacrificial wafer having a diameter that is larger than the first, second and third diameters. A metallized bond plate is located over the sacrificial wafer. The third wafer is anodically bonded to the second side of the first wafer when a voltage is applied to the metallized bond plate while the sacrificial wafer is in place.

20 Claims, 7 Drawing Sheets

(56) References Cited

U.S. PATENT DOCUMENTS

| | | | |
|---|---|---|---|
| 7,400,207 | B2 | 7/2008 | Lipp et al. |
| 7,666,485 | B2 | 2/2010 | Lal et al. |
| 7,902,927 | B2 | 3/2011 | Davis et al. |
| 8,067,991 | B2 | 11/2011 | Youngner et al. |
| 8,129,257 | B2 | 3/2012 | Liang |
| 8,218,590 | B2 | 7/2012 | Youngner et al. |
| 8,242,851 | B2 | 8/2012 | Younger et al. |
| 8,299,860 | B2 | 10/2012 | Youngner et al. |
| 2005/0007118 | A1 | 1/2005 | Kitching et al. |
| 2005/0184815 | A1 | 8/2005 | Lipp et al. |
| 2006/0022761 | A1 | 2/2006 | Abeles et al. |
| 2008/0218281 | A1 | 9/2008 | Lipp et al. |
| 2010/0084284 | A1 | 4/2010 | Happer et al. |
| 2011/0187464 | A1 | 8/2011 | Youngner et al. |
| 2011/0189429 | A1 | 8/2011 | Youngner et al. |

OTHER PUBLICATIONS

European Patent Office, "European Search Report" from Foreign Counterpart of U.S. Appl. No. 12/879,394, Oct. 4, 2011, pp. 1-4, Published in: EPO.

European Patent Office, "Communication Under Rule 71(3) EPC" from Foreign Counterpart of U.S. Appl. No. 12/879,394, May 21, 2012, Published in: EP.

European Patent Office, "European Office Action" from Foreign Counterpart of U.S. Appl. No. 12/879,394, Oct. 19, 2011, pp. 1-5, Published in: EP.

U.S. Patent and Trademark Office, "Notice of Allowance" from U.S. Appl. No. 12/879,394, Jun. 27, 2012, pp. 1-23, Published in: US.

Becerra et al., "Two-Photon Dichroic Atomic Vapor Laser Lock Using Electromagnetically Induced Transparency and Absorption", Jul. 2009, pp. 1315-1320, vol. 26, No. 7, Publisher: Optical Society of America.

Douahi et al, "New Vapor Cell Technology for Chip Scale Atomic Clock", "Frequency Control Symposium", May 1, 2007, pp. 58-61, Publisher: IEEE.

Hasegawa et al, "Fabrication of wall-coated Cs vapor cells for a chip-scale atomic clock", "Optical MEMS and Nanophotonics", Aug. 11, 2008, pp. 162-163, Publisher: IEEE.

At Least as Early as Aug. 16, 2010, "Chip Scale Atomic Clock (CSAC)", "http://www.honeywell.com/sites/aero/technology/avionics3_CA0A2F626-AEE9-48DE-12E5-47CBFC1208EB_HE6088161-0A4F-E40C-C64C-B10F14E21C72.htm", 2010, p. 1, Publisher: Honeywell.

Knappe et al., "Atomic Vapor Cells for Chip-Scale Atomic Clocks With Improved Long-Term Frequency Stability", "Optics Letters", Sep. 15, 2005, pp. 2351-2353, vol. 30, No. 18, Published in: USA.

Liew et al., "Microfabricated alkali atom vapor cells", "Applied Physics Letters", Apr. 5, 2004, pp. 2694-2696, vol. 84, No. 14, Publisher: American Institute of Physics.

Liew et al., "Micromachined Alkali Atom Vapor Cells for Chip-Scale Atomic Clocks", "National Institute of Standards and Technology", Sep. 27, 2004, pp. 113-116, Publisher: IEEE.

Lutwak, et al., "The Chip-Scale Atomic Clock—Coherent Population Trapping vs. Conventional Interrogation", "34th Annual Precise Time and Time Interval (PTTI) Meeting", Dec. 2002, pp. 539-550, Publisher: Symmetricom-Technology Realization Center, Published in: Beverly, MA, USA.

Moreland et al., "Chip Scale Atomic Magnetometers", "Proceedings of the 2005 Meeting of the Military Sensing Symposium, Aug. 22-25, Laurel, MD 2005", Aug. 5, 2005, pp. 1-10, Published in: USA.

Nieradko et al, "New approach of fabrication and dispensing of micromachined cesium vapor cell", Jan. 1, 2008, pp. 1-6, vol. 7, No. 3, Publisher: Journal of Microlithography, Microfabrication, and Microsystems.

Schwindt et al., "Chip-Scale Atomic Magnetometer", "Applied Physics Letters", Dec. 27, 2004, pp. 6409-6411, vol. 85, No. 26, Publisher: American Institute of Physics, Published in: USA.

FABRICATION TECHNIQUES TO ENHANCE PRESSURE UNIFORMITY IN ANODICALLY BONDED VAPOR CELLS

CROSS-REFERENCE TO RELATED APPLICATIONS

This application is a continuation-in-part of U.S. application Ser. No. 12/879,394, filed on Sep. 10, 2010, which claims the benefit of U.S. Provisional Patent Application Ser. No. 61/301,497, filed on Feb. 4, 2010, both of which are incorporated herein by reference.

GOVERNMENT LICENSE RIGHTS

The U.S. Government may have certain rights in the present invention as provided for by the terms of Government Contract prime number FA8650-07-C-1125 with the U.S. Air Force.

BACKGROUND

Chip-Scale Atomic Clocks (CSACs) include vapor cells that contain vapors of an alkali metal such as rubidium (Rb). The vapor cells also typically contain a buffer gas, such as an argon-nitrogen buffer gas blend. The standard technique for fabricating the vapor cells involves anodically bonding two glass wafers on opposing sides of a silicon wafer having a plurality of cell structures that define cavities. The alkali metal vapor and buffer gas are trapped in the cavities of the cell structures between the two glass wafers.

The anodic bond joint starts at the locations between the wafers that are initially in contact and spreads out as the electrostatic potential brings the surfaces together. This lag of the bond front from one area to the next can lead to pressure differences in the vapor cells. Additionally, the presence of a low boiling temperature material like Rb requires the bonding to take place at as low a temperature as possible, otherwise the vapor generated can foul the bond surface. Thus, a high voltage needs to be applied as the wafers are heating, to allow the bond to form as soon as possible. This can result in vapor cells sealing at different times, and thus at different temperatures, which can result in pressure differences in the vapor cells, even on cells that are fabricated side-by-side on the same wafer.

Further, total thickness variations in the two glass wafers cause some of the vapor cells to become hermetically sealed before other vapor cells on the same set of wafers. This problem is further exacerbated in that the temperature is gradually ramped in the bonder equipment, driving some of the trapped gas out of vapor cells that bond late. In addition, there are no easy escape paths for buffer gas that gets trapped in regions that bond late, which can lead to pressure differences in the vapor cells.

Lastly, due to the presence of the buffer gas, the voltage that is applied to accomplish anodic bonding can create a breakdown of the gas, causing a discharge or arc through the gas to ground, essentially shorting out the bonding process.

SUMMARY

A method of fabricating one or more vapor cells comprises forming one or more vapor cell dies in a first wafer having a first diameter, and anodically bonding a second wafer to a first side of the first wafer over the vapor cell dies, the second wafer having a second diameter. A third wafer is positioned over the vapor cell dies on a second side of the first wafer opposite from the second wafer, with the third wafer having a third diameter. A sacrificial wafer is placed over the third wafer, with the sacrificial wafer having a diameter that is larger than the first, second and third diameters. A metallized bond plate is located over the sacrificial wafer. The third wafer is anodically bonded to the second side of the first wafer when a voltage is applied to the metallized bond plate while the sacrificial wafer is in place.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Fabrication techniques are provided for enhancing gas pressure uniformity in anodically bonded vapor cells used in Chip-Scale Atomic Clocks (CSACs). In general, the vapor cells are fabricated with a pair of optically clear glass wafers that are anodically bonded to opposing sides of a substrate such as a silicon wafer having a plurality of cell structures. The vapor cells are fabricated prior to assembly within a physics package for the CSAC.

In one approach for enhancing gas pressure uniformity during vapor cell fabrication, a design feature is incorporated into a wafer surface that creates interconnected vent channels that provide a path from each vapor cell die in the wafer to the perimeter of the wafer. The vent channels allow gas near the interior of the wafer to be in substantially continuous pressure-equilibrium with gas outside of the wafer during anodic bonding. In another approach for enhancing gas pressure uniformity, the anodic bonding process is modified to continually ramp pressure upward as temperature is ramped upward.

The foregoing approaches can be combined such that utilizing the vent channels in the silicon wafer surface along with pressure ramping allows vapor cells that are sealed later in the process, and thus at higher temperature, to also have a higher gas pressure. When cooled to room temperature, the vapor cells sealed at a higher temperature will drop in pressure more than those sealed at a lower temperature. With a higher gas pressure, the later sealing vapor cells can be compensated so the final pressure of all vapor cells is about the same at room temperature.

Further details of the present fabrication techniques are described hereafter with reference to the drawings.

Figure 1:
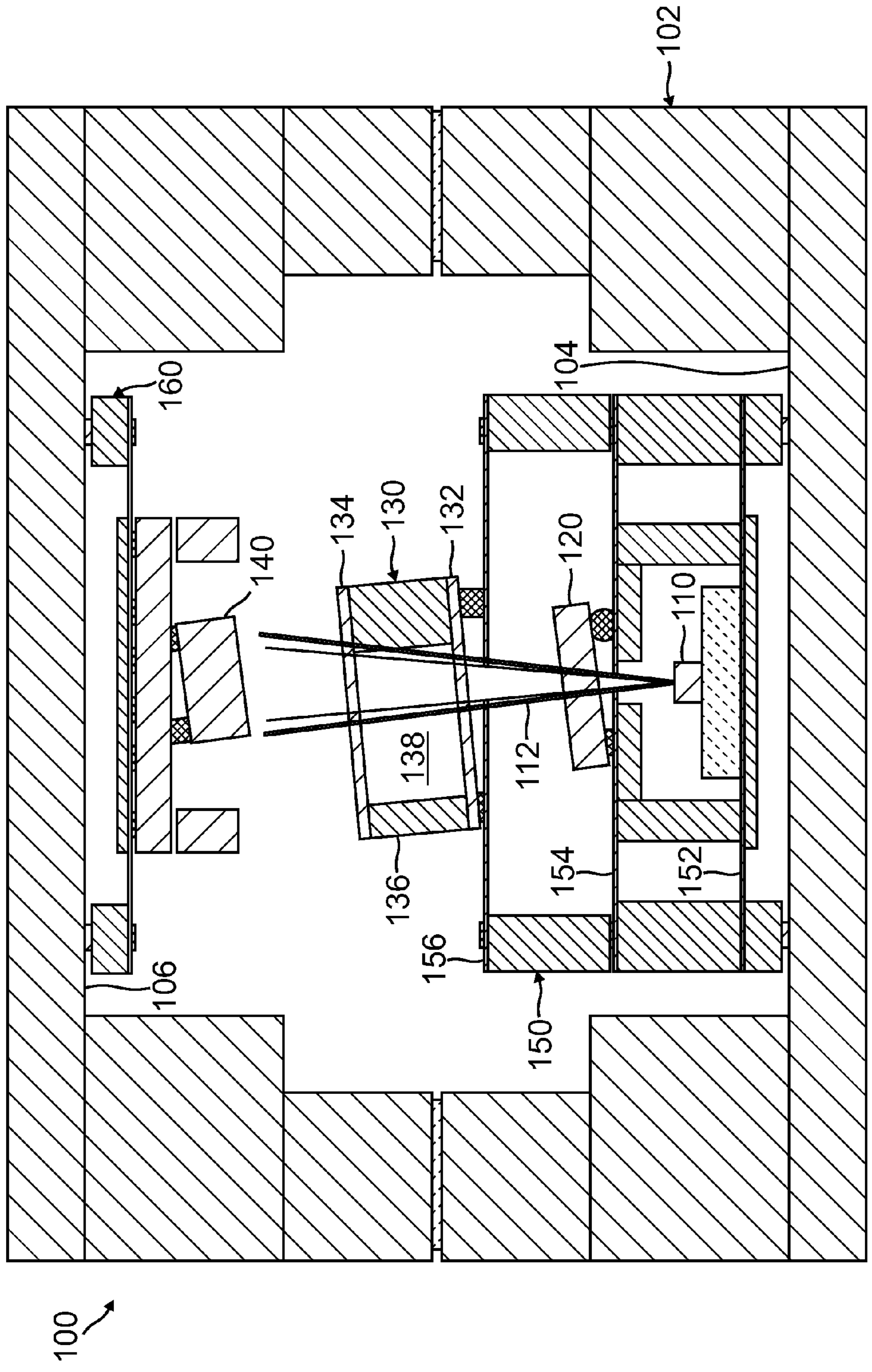
FIG. 1 is a cross-sectional schematic depiction of a physics package for a chip-scale atomic clock that includes a vapor cell according to one embodiment.

FIG. 1 illustrates a CSAC physics package 100 according to one embodiment, which can employ a vapor cell fabricated according to the present approach. The physics package 100 includes an enclosure 102, which houses various mechanical and electronic components of physics package 100. These components can be fabricated as wafer-level micro-electro-mechanical systems (MEMS) devices prior to assembly in enclosure 102. In general, the CSAC components in physics package 100 include a laser die 110 such as a vertical-cavity surface-emitting laser (VCSEL), a quarter wave plate 120 in optical communication with laser die 110, a vapor cell 130 in optical communication with quarter wave plate 120, and an optical detector 140 in optical communication with vapor cell 130.

A laser beam 112 emitted from laser die 110 is directed to pass through quarter wave plate 120 and vapor cell 130 to optical detector 140 during operation of physics package 100. As shown in FIG. 1, quarter wave plate 120, vapor cell 130, and optical detector 140 can be mounted within package 102 at various tilt angles with respect to the optical path of laser beam 112. Tilting these components reduces reflective coupling back into the VCSEL, enhancing CSAC stability.

The various components in physics package 100 are positioned at different levels within enclosure 102 by a set of scaffold structures. As shown in FIG. 1, a lower scaffold 150 is attached to a base surface 104 in enclosure 102. The lower scaffold 150 includes a lower tier 152 that supports laser die 110, a middle tier 154 that supports quarter wave plate 120 above laser die 110, and an upper tier 156 that supports vapor cell 130 above quarter wave plate 120. An upper scaffold structure 160 is attached to a top surface 106 in enclosure 102. The optical detector 140 is affixed to upper scaffold structure 160 above vapor cell 130.

The vapor cell 130 includes a pair of optically clear wafers 132 and 134 such as glass wafers, which are anodically bonded to opposing sides of a substrate 136 such as a silicon wafer. Exemplary glass wafers include Pyrex glass or similar glasses. At least one chamber 138 defined within vapor cell 130 provides an optical path between laser die 110 and optical detector 140 for laser beam 112.

In one approach for fabricating vapor cell 130 prior to assembly within physics package 100, wafer 132 is initially anodically bonded to a base side of substrate 136, after which rubidium or other alkali metal (either in liquid or solid form) is deposited into chamber 138. The wafer 134 is then anodically bonded to the opposing side of substrate 136 to form vapor cell 130. Such bonding typically is accomplished at temperatures from about 250° C. to about 400° C. The bonding process is performed with the wafers 132, 134, and substrate 136, either under high vacuum or backfilled with a buffer gas, such as an argon-nitrogen gas mixture. When the buffer gas is used, the manufacturing equipment containing the components for vapor cell 130 is evacuated, after which the buffer gas is backfilled into chamber 138. Thus, when the bonding is completed to seal vapor cell 130, the alkali metal and any optional buffer gas are trapped within chamber 138.

During the anodic bonding process, the glass wafers, which contain mobile ions such as sodium, are brought into contact with the silicon wafer, with an electrical contact to both the glass and silicon wafers. Both the glass and silicon wafers are heated to at least about 200° C., and a glass wafer electrode is made negative, by at least about 200 V, with respect to the silicon wafer. This causes the sodium in the glass to move toward the negative electrode, and allows for more voltage to be dropped across the gaps between the glass and silicon, causing more intimate contact. At the same time, oxygen ions are released from the glass and flow toward the silicon, helping to form a bridge between the silicon in the glass and the silicon in the silicon wafer, which forms a very strong bond. The anodic bonding process can be operated with a wide variety of background gases and pressures, from well above atmospheric to high vacuum. Higher gas pressures improve heat transfer, and speed up the process. In the case of Rb vapor cells, it is desirable to form a bond at as low a temperature as possible, in the presence of a buffer gas.

The anodic bonding process can be is enhanced by applying a higher voltage during the bonding process, but higher voltage in the presence of a gas can cause arcing. Arcing is a function of the gas type, pressure and distance between electrodes. Arcing can be mitigated by creating a larger path to ground, thus increasing the potential needed to cause the arc.

If the gas type and pressure cannot be altered, then increasing the distance between electrodes can provide a way for applying higher voltage. This can be done by using a sacrificial glass wafer that is inserted between the upper glass wafer of the vapor cell and a high voltage source. The sacrificial glass wafer has a larger diameter than the vapor cell wafers. This allows for the applied voltage to be much higher at the start of the process, which provides for a much improved bonding environment. For example, the applied higher voltage can be from about 800 volts to about 1200 volts.

The sacrificial glass wafer is of the same type as the vapor cell glass wafers used to bond to silicon, and as such allows the passage of current through the mobile ions. By using a larger diameter for the sacrificial wafer, the distance from the high voltage electrode and the top surface of the silicon wafer, which is near ground potential, is increased. This allows for higher voltage bonding without arcing. In addition, the excess sodium that would normally pool on top of the upper glass wafer of the vapor cell is minimized, due to the ability of the sodium ions to pass into the sacrificial glass wafer. This almost eliminates the pitting normally seen on a glass wafer, creating a cleaner light path through the glass. Further details with respect to the sacrificial glass wafer are described hereafter with respect to FIG. 5.

Figure 2:
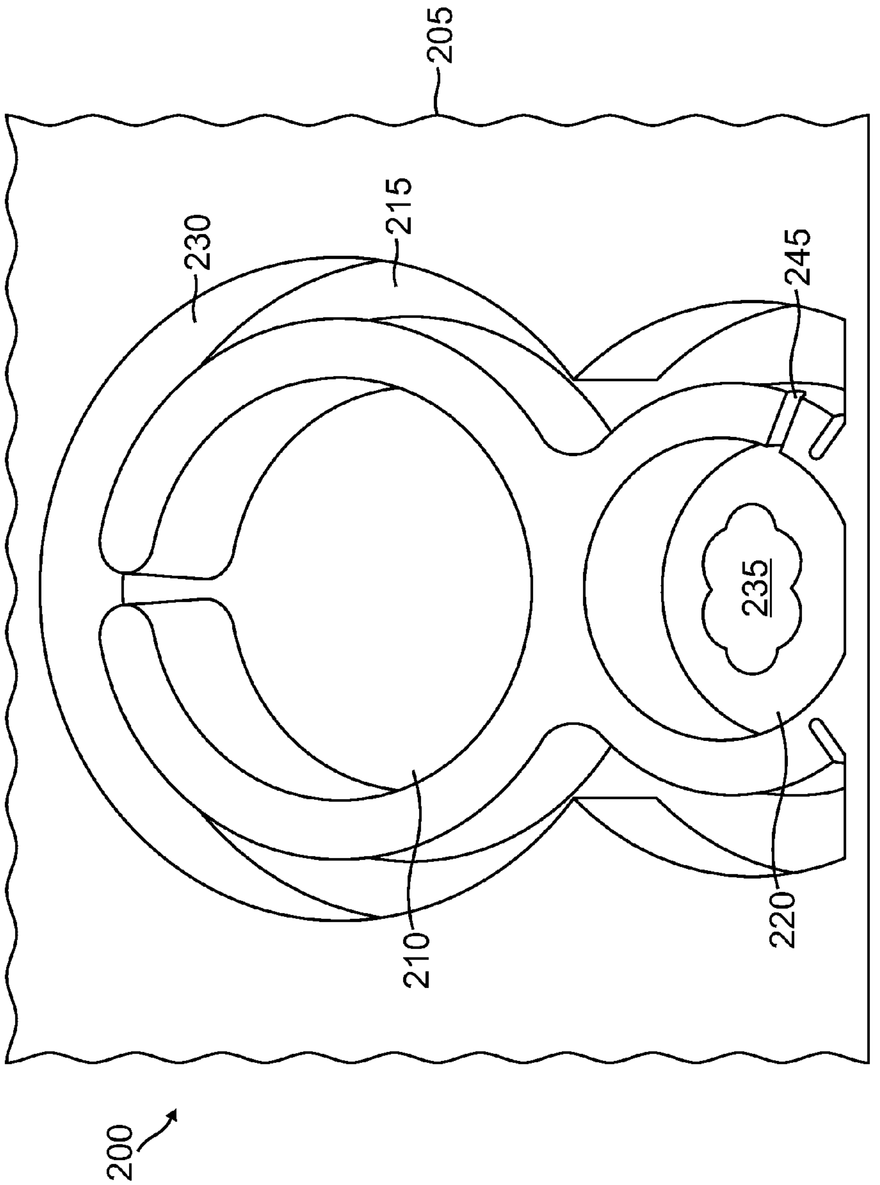
FIG. 2 is a schematic diagram of one embodiment of a vapor cell die for a chip-scale atomic clock that has been formed on a wafer layer.

FIG. 2 illustrates one embodiment of a vapor cell die 200 for a CSAC physics package that has been formed on a wafer layer. The vapor cell die 200 includes a silicon substrate 205 in which a first chamber 210, a second chamber 220, and at least one connecting pathway 215 have been formed. The chambers 210, 220, and pathway 215 are sealed within vapor cell die 200 between glass wafers (such as glass wafers 132, 134) using anodic bonding as described above.

For the embodiment shown in FIG. 2, chamber 210 comprises part of the optical path for the physics package and needs to be kept free of contaminants and precipitates. The rubidium or other alkali metal (shown generally at 235) is deposited as a liquid or solid into chamber 220. The connecting pathway 215 establishes a “tortuous path” (illustrated generally at 230) for the alkali metal vapor molecules to travel from second chamber 220 to first chamber 210. Because of the dynamics of gas molecules, the alkali metal vapor molecules do not flow smoothly through pathway 215, but rather bounce off of the walls of pathway 215 and frequently stick to the walls. In one embodiment, second chamber 220 is isolated from pathway 215 except for a shallow trench 245 to further slow migration of alkali metal vapor from the second chamber 220.

Further details related to fabricating a suitable vapor cell for use in the CSAC physics package are described in U.S. application Ser. No. 12/873,441, filed Sep. 1, 2010, and published as Pub. No. US 2011/0187464 A1, the disclosure of which is incorporated herein by reference.

As discussed previously, the anodic bond joint starts at the locations between the wafers that are initially in contact and spreads out as the electrostatic potential brings the surfaces together. This lag of the bond front from one area to the next can lead to pressure differences if there is no path for gas to move out from between the wafers as the bond fronts move together. This can result in poor buffer gas uniformity in the fabricated vapor cells.

Furthermore, using a low melting temperature material like Rb requires the bonding to take place at as low a temperature as possible, otherwise the vapor generated can foul the bond surface. Thus, a high voltage needs to be applied as the wafers are heating, to allow the bond to form as soon as possible. This can result in vapor cells sealing at different times, and thus at different temperatures, which can also produce pressure differences in the fabricated vapor cells. The problem of poor buffer gas uniformity in fabricated vapor cells can be solved using the techniques discussed hereafter.

Figure 3:
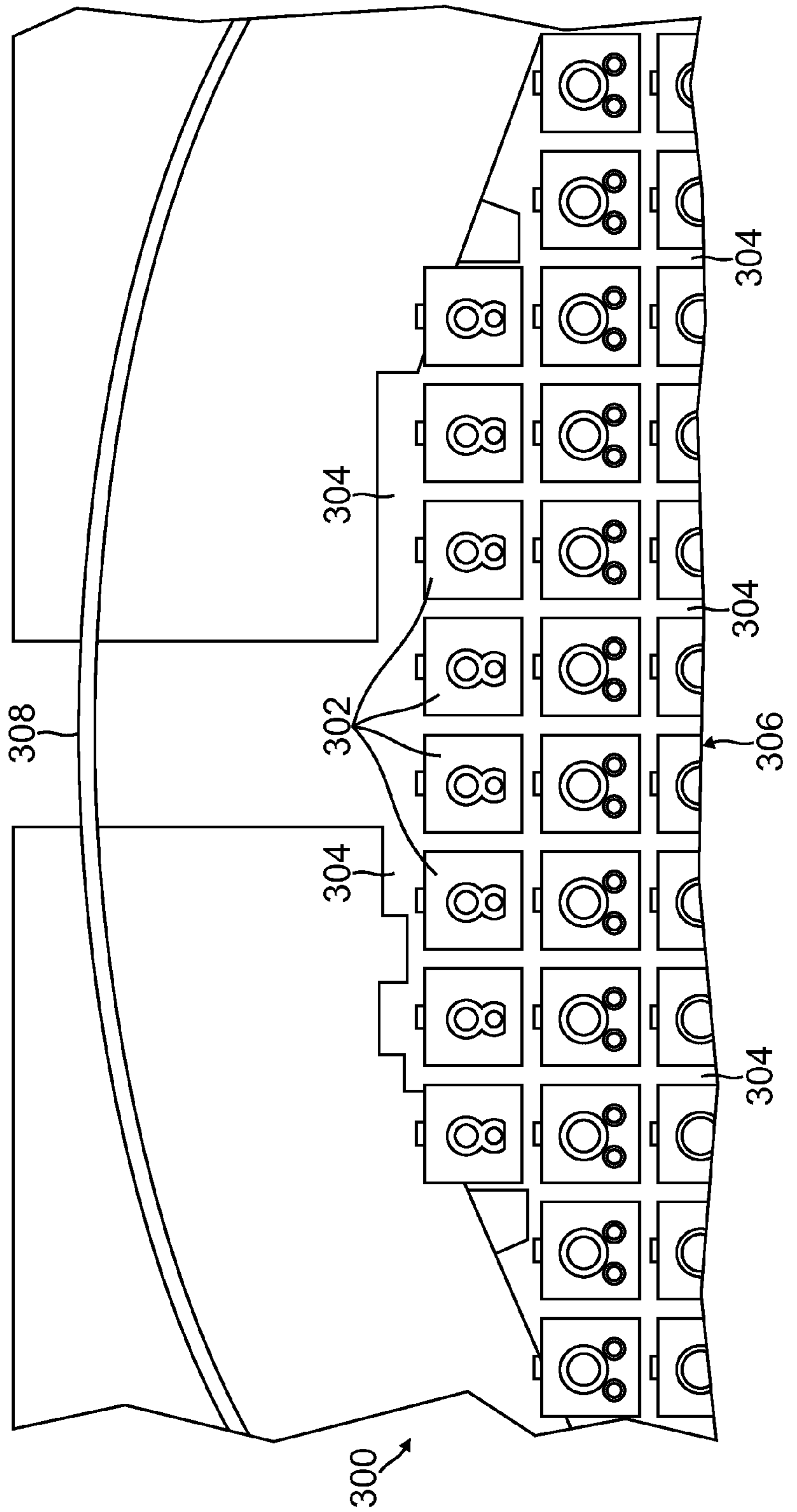
FIG. 3 is partial plan view of a wafer with a plurality of vapor cell dies and vent channels according to one embodiment.

In one approach, vent channels are formed in a surface of the silicon wafer in order to provide pathways for gas to escape to a perimeter of the wafer during anodic bonding. This approach is illustrated in FIG. 3, which shows a wafer 300 for fabricating vapor cells used in a CSAC. The wafer 300 includes a plurality of vapor cell dies 302 and interconnected vent channels 304 that surround vapor cell dies 302. The vapor cell dies 302 and vent channels 304 are located in an interior surface region 306 of wafer 300. The vent channels 304 can be formed with the same processes used to form vapor cell dies 302.

The vent channels 304 provide at least one pathway for gas from each vapor cell die to travel outside of a perimeter 308 of wafer 300. The vent channels 304 allow gas toward the interior surface region 306 to be in substantially continuous pressure-equilibrium with gas outside of perimeter 308 during anodic bonding of glass wafers to opposing sides of wafer 300.

In another approach for enhancing gas pressure uniformity, the anodic bonding process is modified to continually ramp pressure upward as temperature (measured in degrees Kelvin, or degrees absolute) is ramped upward. In this approach, anodic bonding of a first wafer such as a silicon wafer is carried out by increasing a temperature of the first wafer at predetermined rate during anodic bonding of the first wafer to a second wafer such as a glass wafer. The silicon wafer has a plurality of dies each with at least one chamber. A gas pressure between the first and second wafers is also increased at a predetermined rate while the temperature is increasing during anodic bonding.

For example, in one implementation, as the temperature is increased from about 150° C. (423° K) to about 250° C. (523° K) during anodic bonding, the pressure is increased from about 100 torr to about 600 torr. In another example, the pressure can have a starting value of about 100-300 torr, and an ending value of about 500-600 torr.

The foregoing approaches can be combined such that utilizing the vent channels in the wafer surface along with pressure ramping allows vapor cells that are sealed later in the process, and thus at higher temperature, to also have a higher gas pressure. When cooled to room temperature, the vapor cells sealed at a higher temperature will drop in pressure more than those sealed at a lower temperature. With a higher gas pressure, the later sealing vapor cells can be compensated so the final pressure of all vapor cells is about the same at room temperature. By keeping the ratio of the pressure to the temperature constant, the ideal gas law ensures than n (the molar density of the gas in the cells) will remain constant across the wafer.

Figure 4:
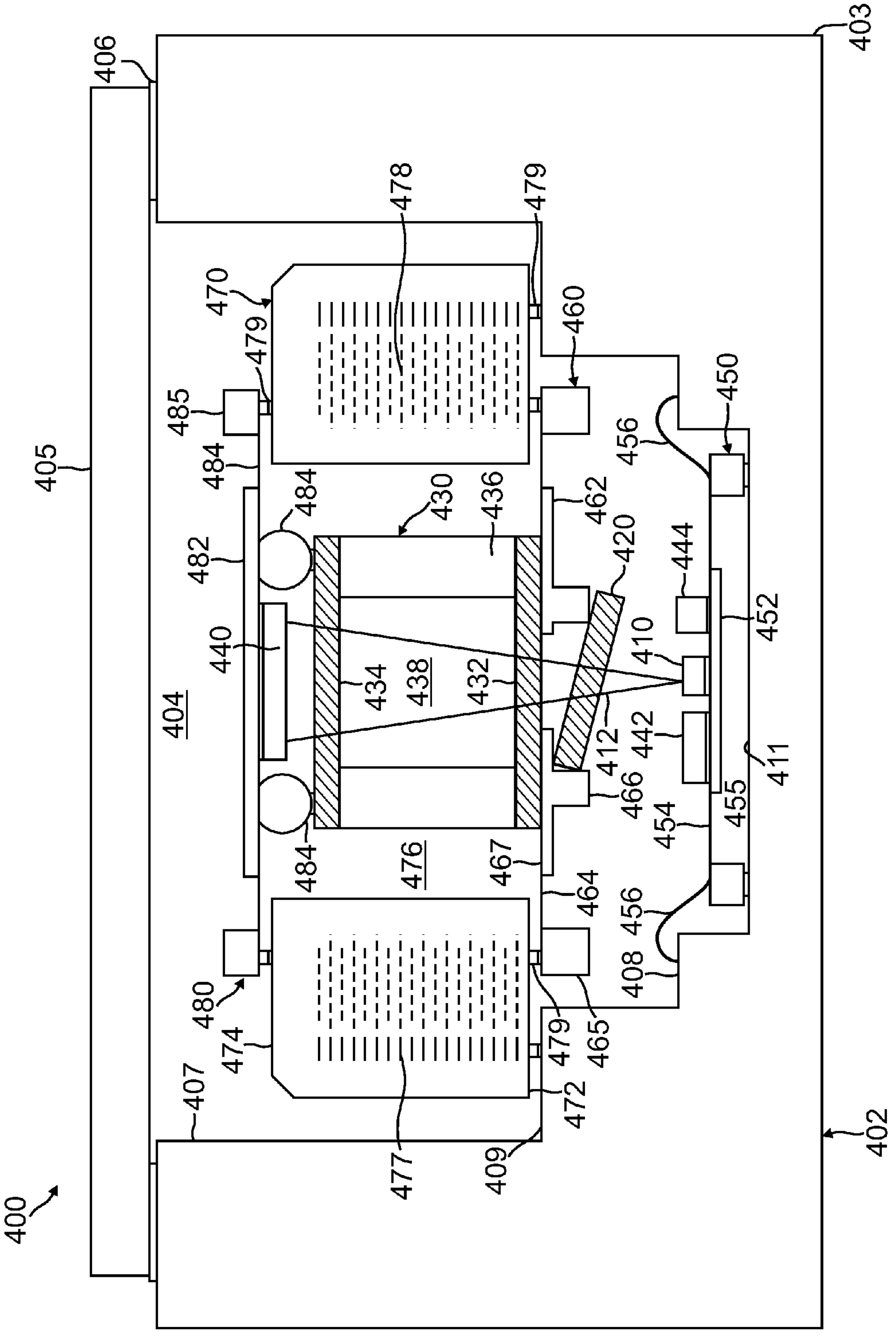
FIG. 4 is a cross-sectional schematic depiction of a physics package for a chip-scale atomic clock that includes a vapor cell according to another embodiment.

FIG. 4 illustrates a CSAC physics package 400 according to another embodiment. The physics package 400 includes an enclosure 402, which houses various mechanical and electronic components of the CSAC. These components can be fabricated as wafer-level micro-electro-mechanical systems (MEMS) devices prior to assembly in physics package 400. In general, the CSAC components in physics package 400 include a laser die 410 such as a vertical-cavity surface-emitting laser (VCSEL), a quarter wave plate 420 in optical communication with laser die 410, a vapor cell 430 in optical communication with quarter wave plate 420, and a first photodetector 440 in optical communication with vapor cell 430. A laser beam 412 emitted from laser die 410 is directed to pass through quarter wave plate 420 and vapor cell 430 to optical detector 440 during operation of the CSAC.

The enclosure 402 includes a body 403 that defines a cavity 404 for holding the components of physics package 400. The enclosure 402 also includes a lid 405 configured to fit over cavity 404 to enclose the components therein. A solder 406 can be used to seal lid 405 to body 403. The cavity 404 is defined by a side surface 407 and a base surface 411 in body 403. The side surface 407 has a lower step 408 and an upper step 409, which along with base surface 411 support various components of the CSAC in a raised position as described further hereafter. The enclosure 402 can be made of a ceramic material such as a high temperature co-fired ceramic (HTCC) material, for example.

The various components of physics package 400 are positioned at different levels within enclosure 402 by a set of scaffold structures. The scaffold structures generally include a membrane such as a tether suspended between a frame, and a stiffening member such as a die attached to the membrane. The frame and stiffening member can be composed of silicon and the membrane can be composed of polyimide, for example.

As shown in FIG. 4, a lower scaffold structure 450 is attached to base surface 411 in body 403. The lower scaffold structure 450 includes a scaffold die 452 coupled to a tether 454 that is attached to a frame 455. The laser die 410 is mounted to an upper surface of die 452 along with other electronic components, including a second photodetector 442 and a resistor 444 such as a surface mount technology (SMT) resistor. The lower scaffold structure 450 and components thereon are electrically connected to body 403 through a plurality of wire bonds 456 connected to respective pads on lower step 408.

A middle scaffold structure 460 includes a scaffold die 462 coupled to a tether 464 that is attached to a frame 465. The scaffold die 462 has an opening therethrough to permit passage of laser beam 412. The middle scaffold structure 460 has a tilting feature 466 on which quarter wave plate 420 is mounted, such as with an adhesive. As shown in FIG. 4, quarter wave plate 420 can be mounted on tilting feature 466 at a preselected tilt angle with respect to the optical path of laser beam 412. The middle scaffold structure 460 has an upper surface 467 on which vapor cell 430 is mounted, such as with an adhesive. The middle scaffold structure 460 is attached to a spacer 470 on a lower surface 472 thereof with an adhesive such as an epoxy or other suitable attachment method.

An upper scaffold structure 480 is positioned over spacer 470, and includes a scaffold die 482 coupled to a tether 484 that is attached to a frame 485. The photodetector 440 is attached to die 482 above vapor cell 430. The vapor cell 430 is also attached to die 482 through a plurality of solder balls 484, which keep photodetector 440 and vapor cell 430 spaced apart from each other. The upper scaffold structure 480 is attached to an upper surface 474 of spacer 470 with an adhesive such as an epoxy or other suitable attachment method.

The spacer 470, which can be in the shape of a washer, defines an aperture 476 in which vapor cell 430 is located. The spacer 470 includes interconnect wiring 477 to provide electrical contacts for upper scaffold structure 480 and middle scaffold structure 460. The spacer 70 also includes magnetic coil windings 478 that provide a bias field for vapor cell 430. The spacer 470 is mounted to upper step 409 of enclosure 402 with an adhesive such as an epoxy. A plurality of metal stud bumps 479, such as gold stud bumps, provide electrical connections from spacer 470 to enclosure 402 and to scaffold structures 460, 480. The spacer 470 can be made of a ceramic material such as a low temperature co-fired ceramic (LTCC) material.

The vapor cell 430 includes a pair of optically clear glass wafers, including a lower glass wafer 432 and an upper glass wafer 434 that are anodically bonded to opposing sides of a substrate such as a silicon wafer 436. At least one chamber 438 within vapor cell 430 provides an optical path between laser die 410 and photodetector 440 for laser beam 412.

In fabricating vapor cell 430 prior to assembly within enclosure 402, lower glass wafer 432 is initially anodically bonded to a base side of substrate 436, after which rubidium or other alkali metal is deposited into chamber 438. The upper glass wafer 434 is then anodically bonded to the opposing side of substrate 436 to form vapor cell 430. The bonding process is performed with the wafers glass 432, 434 and silicon wafer 436 either under high vacuum or optionally backfilled with a buffer gas. When the bonding is completed to seal vapor cell 430, the alkali metal and any optional buffer gas are trapped within chamber 438.

Figure 5:
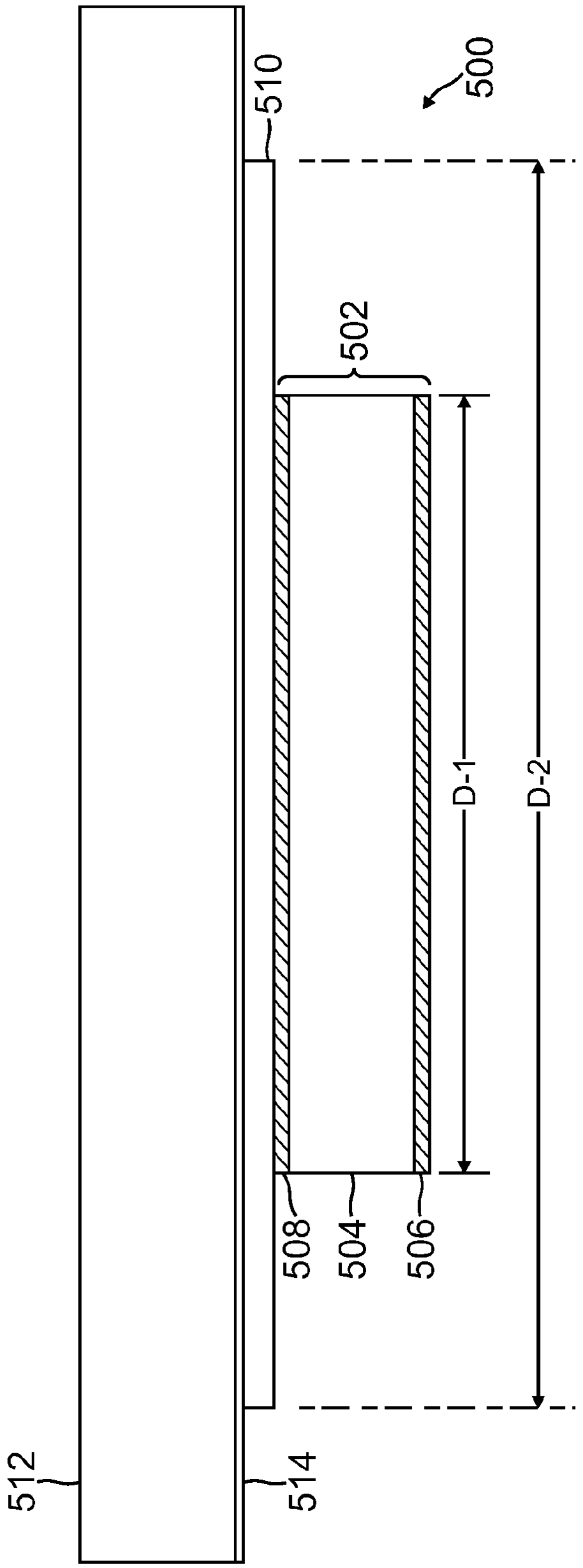
FIG. 5 illustrates a wafer configuration for an anodic bonding process that employs a sacrificial wafer.

As discussed previously above, the anodic bonding of the glass wafers can be enhanced by using a sacrificial glass wafer that is inserted between the upper glass wafer of the vapor cell and a high voltage source. FIG. 5 shows a wafer configuration 500 used in the enhanced anionic bonding approach. A vapor cell 502 has been partially formed and includes a first wafer 504 such as a silicon wafer, and a second wafer 506 such as a glass wafer that is anodically bonded to one side of first wafer 504. A third wafer 508 such as a glass wafer is positioned on an opposing side of first wafer 504. As shown in FIG. 5, the first wafer 504, second wafer 506, and third wafer 508 all have substantially the same diameter D-1.

A sacrificial wafer 510 such as a sacrificial glass wafer is inserted between third wafer 508 and a metallized bond plate 512 that connects to a high voltage source. The sacrificial wafer 510 has a diameter D-2 that is larger than diameter D-1. By using a larger diameter for the sacrificial wafer, the distance from an exposed portion 514 of metallized bond plate 512 to the bonding surface of the silicon wafer, which is near ground potential, is increased. The diameter D-2 of sacrificial wafer 510 is sufficiently large so as to prevent arcing when third wafer 508 is anodically bonded to first wafer 504.

Figure 6:
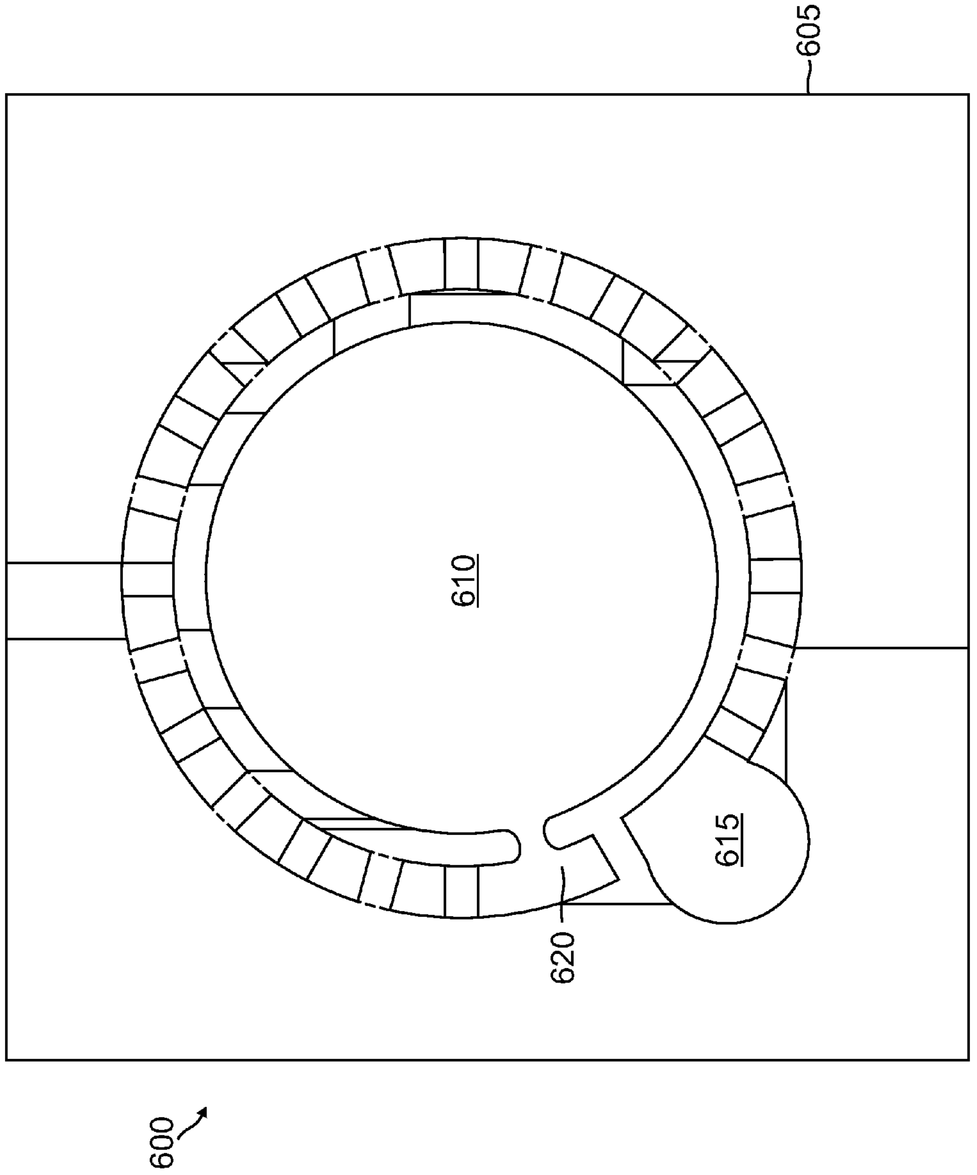
FIG. 6 is a schematic diagram of another embodiment of a vapor cell die for a chip-scale atomic clock that has been formed on a wafer layer.

FIG. 6 illustrates one embodiment of a vapor cell die 600 for a CSAC physics package that has been formed on a wafer layer. The vapor cell die 600 includes a substrate 605 such as a silicon substrate in which a first chamber 610, a second chamber 615, and at least one connecting pathway 620 have been formed. The chambers 610, 615, and pathway 620 can be sealed within vapor cell die 600 between glass wafers using anodic bonding as described above. The first chamber 610 comprises part of the optical path for the CSAC. The connecting pathway 620 establishes a "tortuous path" for the alkali metal vapor molecules to travel from second chamber 615 to first chamber 610.

Figure 7:
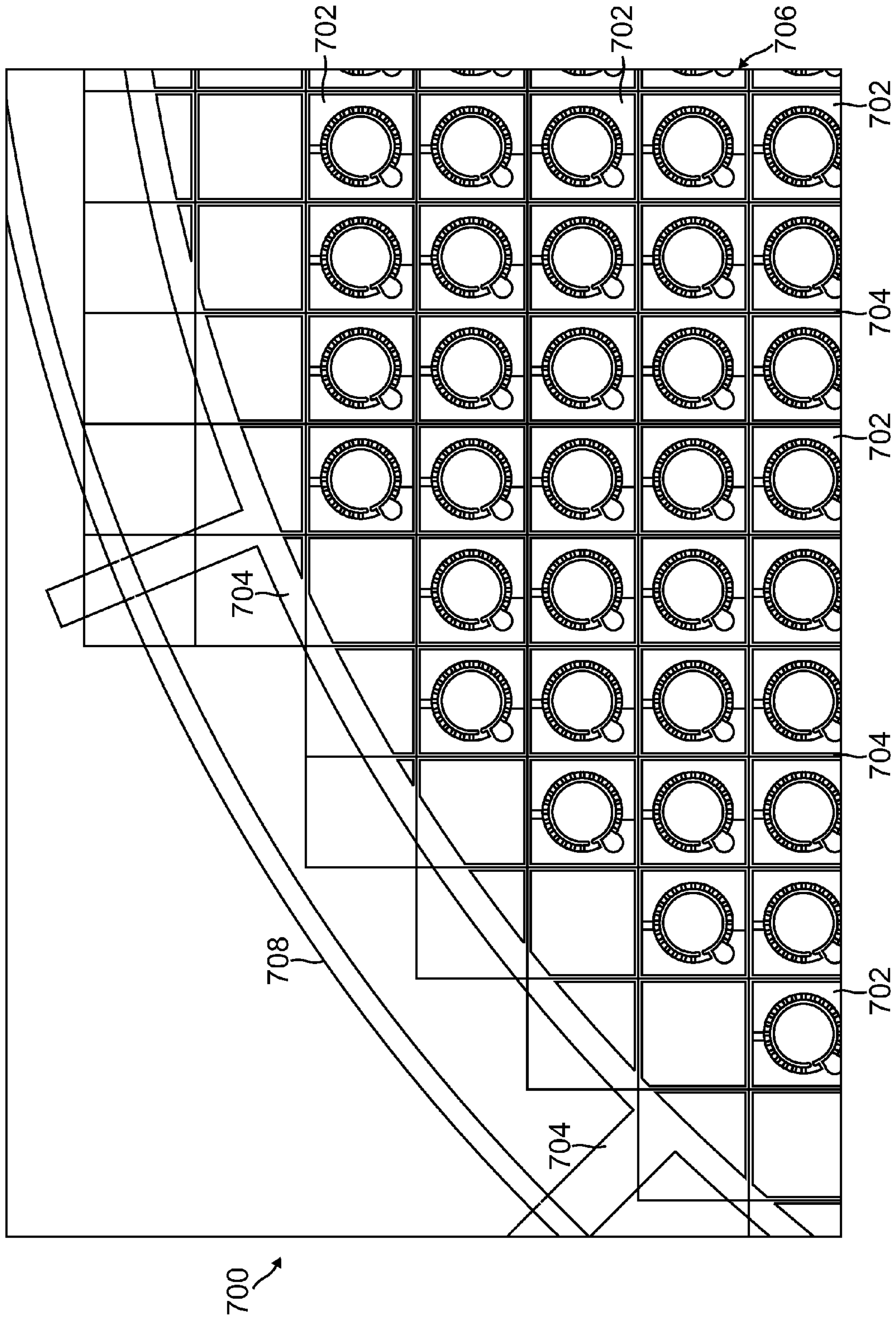
FIG. 7 is partial plan view of a wafer with a plurality of vapor cell dies and vent channels according to another embodiment.

As described previously, vent channels can be formed in a surface of the silicon wafer in order to provide pathways for gas to escape to a perimeter of the wafer during anodic bonding. FIG. 7 illustrates another embodiment of this approach, in which a silicon wafer 700 is used for fabricating vapor cells. The wafer 700 includes a plurality of vapor cell dies 702 and interconnected vent channels 704 that surround vapor cell dies 702. The vapor cell dies 702 and vent channels 704 are located in an interior surface region 706 of wafer 700. The vent channels 704 can be formed with the same processes used to form vapor cell dies 702.

The vent channels 704 provide multiple pathways for gas from each vapor cell die to travel outside of a perimeter 708 of wafer 700. The vent channels 704 allow gas toward the interior surface region 706 to be in substantially continuous pressure-equilibrium with gas outside of perimeter 708 during anodic bonding of glass wafers to opposing sides of wafer 700.

EXAMPLE EMBODIMENTS

Example 1 includes a method of fabricating one or more vapor cells, the method comprising forming one or more vapor cell dies in a first wafer having an interior surface region and a perimeter, the first wafer having a first diameter; anodically bonding a second wafer to a first side of the first wafer over the vapor cell dies, the second wafer having a second diameter; positioning a third wafer over the vapor cell dies on a second side of the first wafer opposite from the second wafer, the third wafer having a third diameter; placing a sacrificial wafer over the third wafer, the sacrificial wafer having a diameter that is larger than the first, second and third diameters; locating a metallized bond plate over the sacrificial wafer; and anodically bonding the third wafer to the second side of the first wafer when a voltage is applied to the metallized bond plate while the sacrificial wafer is in place.

Example 2 includes the method of Example 1, wherein the first wafer comprises a silicon wafer, and the second and third wafers each comprise a glass wafer.

Example 3 includes the method of any of Examples 1 and 2, wherein the sacrificial wafer comprises a glass wafer.

Example 4 includes the method of any of Examples 1-3, wherein the diameter of the sacrificial wafer is sufficiently large to prevent arcing when the voltage is applied to the metallized bond plate.

Example 5 includes the method of any of Examples 1-4, and further comprising forming one or more interconnected vent channels in the first wafer, the vent channels providing at least one pathway for gas from the one or more vapor cell dies to travel outside of the perimeter of the first wafer.

Example 6 includes the method of Example 5, wherein the vent channels allow gas toward the interior surface region of the first wafer to be in substantially continuous pressure-equilibrium with gas outside of the perimeter of the first wafer during the anodic bonding of the second and third wafers to the first wafer.

Example 7 includes the method of any of Examples 1-6, wherein the one or more vapor cells are configured for a chip-scale atomic clock physics package.

Example 8 includes the method of any of Examples 1-7, wherein the one or more vapor cell dies each comprise a substrate having a first chamber, a second chamber, and at least one connecting pathway between the first and second chambers.

Example 9 includes the method of any of Examples 1-8, wherein during the anodic bonding, a temperature of the first wafer is ramped upward at a predetermined rate.

Example 10 includes the method of Example 9, wherein a gas pressure is ramped upward at a predetermined rate while the temperature is ramped upward.

Example 11 includes the method of Example 10, wherein the gas pressure is ramped upward from about 100 torr to about 600 torr during the anodic bonding.

Example 12 includes a wafer configuration for fabricating vapor cells that comprises a first wafer comprising a plurality of vapor cell dies, the first wafer having an interior surface region and a perimeter, the first wafer having a first diameter. A second wafer is anodically bonded to a first side of the first wafer over the vapor cell dies, with the second wafer having a second diameter that is substantially the same as the first diameter. A third wafer is located over the vapor cell dies on a second side of the first wafer opposite from the second wafer, the third wafer having a third diameter that is substantially the same as the first and second diameters. A sacrificial wafer is located over the third wafer, the sacrificial wafer having a diameter that is larger than the first, second and third diameters. The diameter of the sacrificial wafer is sufficiently large to prevent arcing when the third wafer is anodically bonded to the first wafer.

Example 13 includes the wafer configuration of Example 12, wherein the first wafer comprises a silicon wafer, and the second and third wafers each comprise a glass wafer.

Example 14 includes the wafer configuration of any of Examples 12 and 13, wherein the sacrificial wafer comprises a glass wafer.

Example 15 includes the wafer configuration of any of Examples 12-14, further comprising a plurality of interconnected vent channels in the first wafer, the vent channels providing at least one pathway for gas from the vapor cell dies to travel outside of the perimeter of the first wafer.

Example 16 includes the wafer configuration of Example 15, wherein the vent channels allow gas toward the interior surface region of the first wafer to be in substantially continuous pressure-equilibrium with gas outside of the perimeter of the first wafer when the second and third wafers are anodically bonded to the first wafer.

Example 17 includes the wafer configuration of any of Examples 12-16, wherein the sacrificial wafer is located between the third wafer and a metallized bond plate.

Example 18 includes the wafer configuration of any of Examples 12-17, wherein the vapor cells dies are configured for a chip-scale atomic clock physics package.

Example 19 includes the wafer configuration of any of Examples 12-18, wherein the vapor cell dies each comprise a substrate having a first chamber, a second chamber, and at least one connecting pathway between the first and second chambers.

Example 20 includes a method of fabricating a plurality of vapor cells, the method comprising forming a plurality of vapor cell dies in a silicon wafer having a first diameter; anodically bonding a first glass wafer to a first side of the silicon wafer over the vapor cell dies, the first glass wafer having a second diameter that is substantially the same as the first diameter; positioning a second glass wafer over the vapor cell dies on a second side of the silicon wafer opposite from the first glass wafer, the second glass wafer having a third diameter that is substantially the same as the first and second diameters; placing a sacrificial glass wafer over the second glass wafer, the sacrificial glass wafer having a diameter that is larger than the first, second, and third diameters; locating a metallized bond plate over the sacrificial glass wafer; and anodically bonding the second glass wafer to the second side of the silicon wafer when a voltage is applied to the metallized bond plate while the sacrificial glass wafer is in place, the diameter of the sacrificial glass wafer sufficiently large to prevent arcing when the voltage is applied to the metallized bond plate.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method of fabricating one or more vapor cells, the method comprising:

forming one or more vapor cell dies in a first wafer having an interior surface region and a perimeter, the first wafer having a first diameter;

anodically bonding a second wafer to a first side of the first wafer over the vapor cell dies, the second wafer having a second diameter;

positioning a third wafer over the vapor cell dies on a second side of the first wafer opposite from the second wafer, the third wafer having a third diameter;

placing a sacrificial wafer over the third wafer, the sacrificial wafer having a diameter that is larger than the first, second and third diameters;

locating a metallized bond plate over the sacrificial wafer; and anodically bonding the third wafer to the second side of the first wafer when a voltage is applied to the metallized bond plate while the sacrificial wafer is in place.

2. The method of claim 1, wherein the first wafer comprises a silicon wafer, and the second and third wafers each comprise a glass wafer.

3. The method of claim 2, wherein the sacrificial wafer comprises a glass wafer.

4. The method of claim 1, wherein the diameter of the sacrificial wafer is sufficiently large to prevent arcing when the voltage is applied to the metallized bond plate.

5. The method of claim 1, further comprising forming one or more interconnected vent channels in the first wafer, the vent channels providing at least one pathway for gas from the one or more vapor cell dies to travel outside of the perimeter of the first wafer.

6. The method of claim 5, wherein the vent channels allow gas toward the interior surface region of the first wafer to be in substantially continuous pressure-equilibrium with gas outside of the perimeter of the first wafer during the anodic bonding of the second and third wafers to the first wafer.

7. The method of claim 1, wherein the one or more vapor cells are configured for a chip-scale atomic clock physics package.

8. The method of claim 1, wherein the one or more vapor cell dies each comprise a substrate having a first chamber, a second chamber, and at least one connecting pathway between the first and second chambers.

9. The method of claim 1, wherein during the anodic bonding, a temperature of the first wafer is ramped upward at a predetermined rate.

10. The method of claim 9, wherein a gas pressure is ramped upward at a predetermined rate while the temperature is ramped upward.

11. The method of claim 10, wherein the gas pressure is ramped upward from about 100 torr to about 600 torr during the anodic bonding.

12. A wafer configuration for fabricating vapor cells, comprising:

a first wafer comprising a plurality of vapor cell dies, the first wafer having an interior surface region and a perimeter, the first wafer having a first diameter;

a second wafer anodically bonded to a first side of the first wafer over the vapor cell dies, the second wafer having a second diameter that is substantially the same as the first diameter;

a third wafer located over the vapor cell dies on a second side of the first wafer opposite from the second wafer, the third wafer having a third diameter that is substantially the same as the first and second diameters; and a sacrificial wafer located over the third wafer, the sacrificial wafer having a diameter that is larger than the first, second and third diameters;

wherein the diameter of the sacrificial wafer is sufficiently large to prevent arcing when the third wafer is anodically bonded to the first wafer.

13. The wafer configuration of claim 12, wherein the first wafer comprises a silicon wafer, and the second and third wafers each comprise a glass wafer.

14. The wafer configuration of claim 13, wherein the sacrificial wafer comprises a glass wafer.

15. The wafer configuration of claim 12, further comprising a plurality of interconnected vent channels in the first wafer, the vent channels providing at least one pathway for gas from the vapor cell dies to travel outside of the perimeter of the first wafer.

16. The wafer structure of claim 15, wherein the vent channels allow gas toward the interior surface region of the first wafer to be in substantially continuous pressure-equilibrium with gas outside of the perimeter of the first wafer when the second and third wafers are anodically bonded to the first wafer.

17. The wafer configuration of claim 12, wherein the sacrificial wafer is located between the third wafer and a metallized bond plate.

18. The wafer configuration of claim 12, wherein the vapor cells dies are configured for a chip-scale atomic clock physics package.

19. The wafer configuration of claim 12, wherein the vapor cell dies each comprise a substrate having a first chamber, a second chamber, and at least one connecting pathway between the first and second chambers.

20. A method of fabricating a plurality of vapor cells, the method comprising:

forming a plurality of vapor cell dies in a silicon wafer having a first diameter;

anodically bonding a first glass wafer to a first side of the silicon wafer over the vapor cell dies, the first glass wafer having a second diameter that is substantially the same as the first diameter;

positioning a second glass wafer over the vapor cell dies on a second side of the silicon wafer opposite from the first glass wafer, the second glass wafer having a third diameter that is substantially the same as the first and second diameters;

placing a sacrificial glass wafer over the second glass wafer, the sacrificial glass wafer having a diameter that is larger than the first, second and third diameters;

locating a metallized bond plate over the sacrificial glass wafer; and anodically bonding the second glass wafer to the second side of the silicon wafer when a voltage is applied to the metallized bond plate while the sacrificial glass wafer is in place, the diameter of the sacrificial glass wafer sufficiently large to prevent arcing when the voltage is applied to the metallized bond plate.

* * * * *